United States Patent [19]

Murakami et al.

[11] Patent Number: 5,115,290
[45] Date of Patent: May 19, 1992

[54] MOS TYPE SEMICONDUCTOR DEVICE AND METHOD FOR MANUFACTURING THE SAME

[75] Inventors: Kouji Murakami, Tokyo; Taira Matsunaga, Yokohama, both of Japan

[73] Assignee: Kabushiki Kaisha Toshiba, Kawasaki, Japan

[21] Appl. No.: 577,749

[22] Filed: Sep. 5, 1990

[30] Foreign Application Priority Data

Sep. 6, 1989 [JP] Japan .................. 1-230642

[51] Int. Cl.$^5$ ........................................ H01L 29/06
[52] U.S. Cl. .................. 357/23.9; 357/23.3; 437/39
[58] Field of Search ............ 357/23.4, 715, 71, 675, 357/67, 23.9, 23.3; 437/192, 200, 40, 41

[56] References Cited

U.S. PATENT DOCUMENTS

| | | | |
|---|---|---|---|
| 4,319,395 | 3/1982 | Lund et al. | 437/41 |
| 4,434,013 | 2/1984 | Bol | 437/41 |
| 4,558,338 | 12/1985 | Sakata | 357/23.9 |
| 4,707,723 | 11/1987 | Okamoto et al. | 357/67 |
| 4,735,913 | 4/1988 | Hayes | 437/41 |
| 4,843,033 | 6/1989 | Plumton et al. | 437/200 |
| 4,849,376 | 7/1989 | Balzan et al. | 437/41 |

FOREIGN PATENT DOCUMENTS

| | | | |
|---|---|---|---|
| 52-25582 | 2/1977 | Japan | 357/23.5 |
| 54-47489 | 4/1979 | Japan | 357/23.5 |
| 56-85866 | 7/1981 | Japan | 357/23.5 |
| 61-63058(A) | 4/1986 | Japan . | |
| 61-134072(A) | 6/1986 | Japan . | |
| 61-168264(A) | 7/1986 | Japan . | |
| 63-44768 | 2/1988 | Japan | 357/23.3 |

Primary Examiner—Jerome Jackson, Jr.
Assistant Examiner—Hung Xuan Dang
Attorney, Agent, or Firm—Finnegan, Henderson, Farabow, Garrett & Dunner

[57] ABSTRACT

A MOS type semiconductor device and a method for the manufacture of the same are disclosed in which a gate electrode is so formed over a semiconductor substrate of a first conductivity type with a gate insulating film formed therebetween as to provide a three-layered structure composed of a first high melting point metal silicide layer formed on the gate insulating film, high melting point metal layer formed on the first high melting point metal silicide and a second high melting point metal silicide layer formed on the high melting point metal layer. In the gate electrode, a length of the first high melting point silicide layer defined in the same direction as that in which a channel region extends is made smaller in length than the high melting point metal layer.

2 Claims, 4 Drawing Sheets

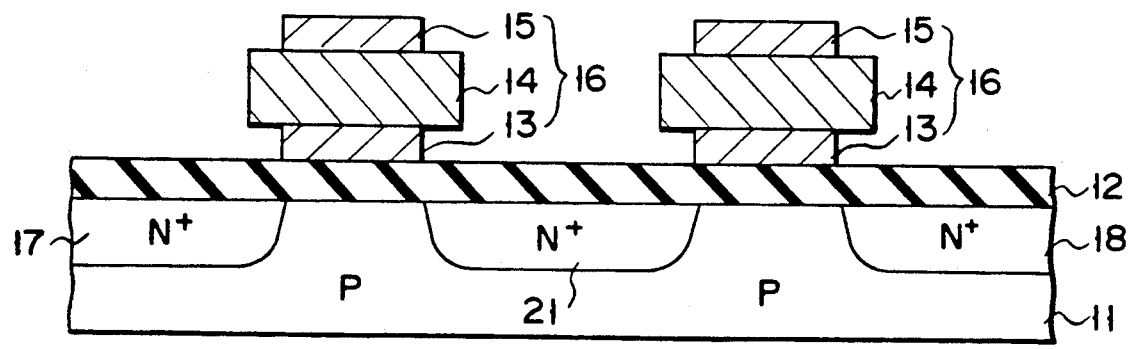
F I G. 5
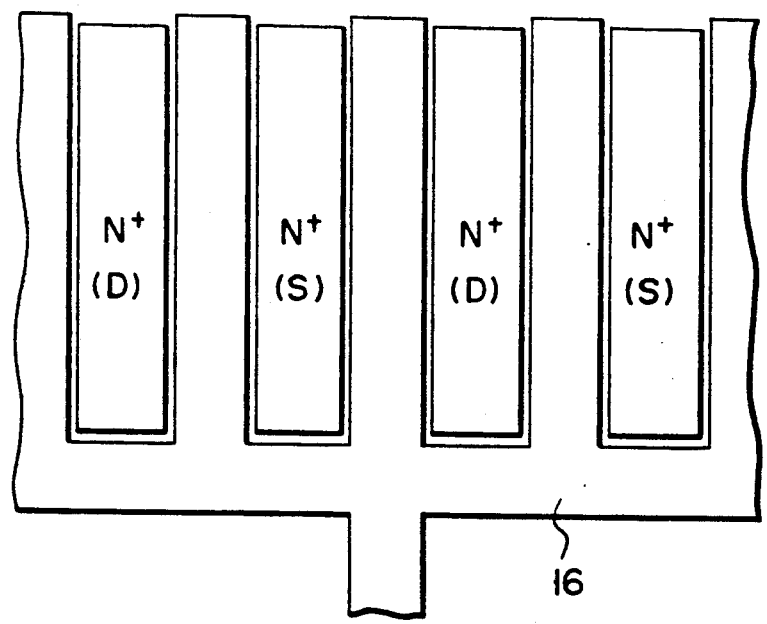
F I G. 6

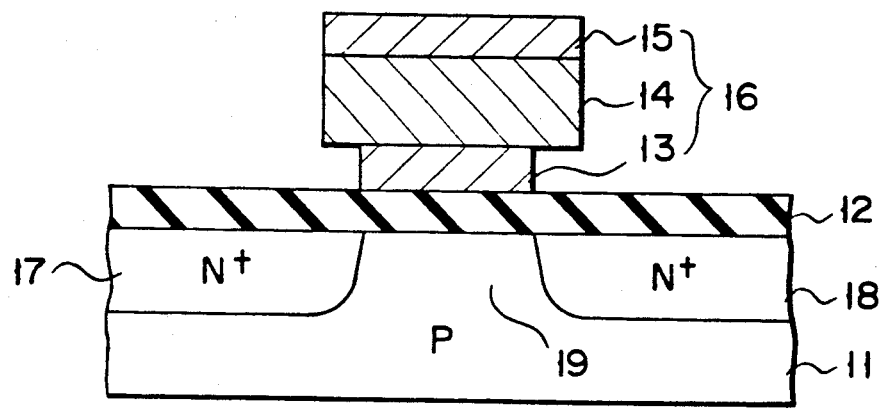
F I G. 7
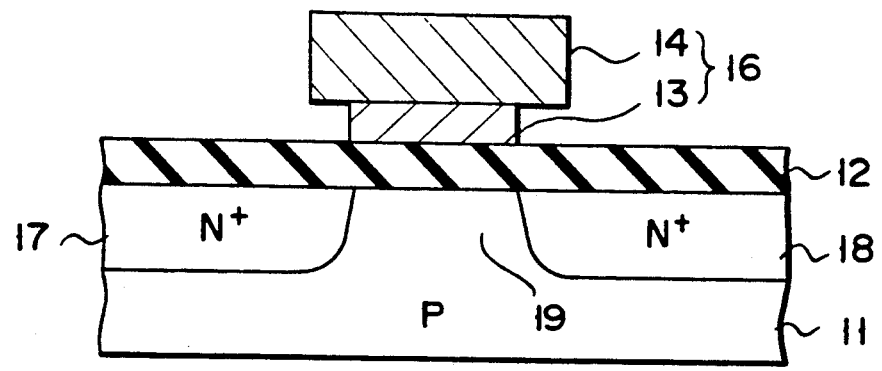
F I G. 8

MOS TYPE SEMICONDUCTOR DEVICE AND METHOD FOR MANUFACTURING THE SAME

BACKGROUND OF THE INVENTION

1. Field of the Invention

The present invention relates to a MOS type semiconductor device using high melting point metal as a gate electrode and a method for manufacturing the same.

2. Description of the Related Art

A MOS gate electrode is generally composed of a metal so as to reduce its own resistance. In a MOS FET, in particular, which has its source and drain regions formed in a self-aligned way relative to a gate electrode, a gate electrode is formed using a high melting point metal so as to prevent the gate electrode from being melted at a high temperature step for forming source and drain regions. However, the gate electrode formed of a high melting point metal is liable to be separated from a gate insulating film when it is heated at a temperature of over 1000° C.

A MOS FET device having a cross-sectional structure as shown, for example, in FIG. 1 is used so as to prevent the separation of the gate electrode as set out above, the oxidation of the gate electrode per se and so on.

In FIG. 1, reference numeral 31 shows a p type silicon semiconductor substrate. A gate oxide film 32 is formed on the semiconductor substrate 31. A gate electrode 36 is formed over the substrate 31 and composed of a three-layered structure of a first high melting point metal silicide 33, a high melting point metal layer 34 and a second high melting point metal silicide layer 35. N+ type diffusion layers 37 and 38 are formed as source and drain regions in the surface portion of the substrate 31.

Here, the widths of the layers of the gate electrode 36 of a three-layered structure, that is a length (hereinafter referred to as a width) defined in a direction parallel to that in which the channel of a MOS FET extends, are exactly equal to each other or are somewhat decreased toward a top layer as shown in FIG. 1 which is caused by a side etching at an etching step.

In the MOS FET having a cross-sectional structure as set out above, a gate area is determined by the high melting point metal silicide layer 33 of a largest width. Stated in another way, a value of a gate capacitance in the MOS FET was determined by the width of the first high melting point metal silicide layer 33 situated near the substrate 31, so that a greater gate capacitance was involved in the conventional structure. Further, the resistive value of the gate electrode is determined by that of the high melting point metal layer 34 of a lowest resistivity. Since the width of the layer 34 is made smaller than that of the first high melting point silicide layer 33 by an effect of the side etching, etc., a gate's resistive value is increased by that extent. As a result, an improved high frequency characteristic cannot be expected from the conventional MOS FET.

SUMMARY OF THE INVENTION

It is accordingly the object of the present invention to provide a MOS type semiconductor device and a method for the manufacture of the same, which can withstand a high temperature step or steps and reveal an excellent high frequency characteristic.

According to the present invention, there is provided a MOS type semiconductor device comprising:

a semiconductor substrate for a first conductivity type;

source and drain regions of a second conductivity type formed in a surface portion of the substrate;

a channel region formed in the surface portion of the substrate such that it is situated between the source and drain regions;

a gate insulating film formed at least on the channel region; and a gate electrode comprised of a first high melting point metal silicide layer formed on the gate insulating film, a high melting point metal layer formed on the first melting point metal silicide layer and a second high melting point metal silicide layer formed on the high melting point metal layer, in which a length of the first high melting metal silicide layer defined in a direction in which the channel region extends is made shorter in length than the high melting point metal layer.

In another aspect of the present invention, there is provided a method for manufacturing a MOS type semiconductor device, which comprises the steps of:

forming a gate insulating film on a semiconductor substrate of a first conductivity type;

depositing a first high melting point metal silicide layer on the gate insulating film;

depositing a high melting point metal layer on the first high melting point silicide layer;

depositing a second high melting point metal silicide layer on the high melting point metal layer; and forming a gate electrode over the semiconductor substrate by selectively etching the first high melting point metal silicide layer, high melting point metal layer and second high melting point metal silicide layer by a chemical dry etching in a mixed gas atmosphere of $CF_4$ and $O_2$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a cross-sectional view showing a MOS type semiconductor device according to a third embodiment of the present invention:

FIG. 6 is a plan view, partly broken away, showing a fourth embodiment of the present invention;

FIG. 7 is a cross-sectional view showing a MOS type semiconductor device according to a fifth embodiment of the present invention; and FIG. 8 is a cross-sectional view showing a MOS type semiconductor device according to a sixth embodiment of the present invention.

DETAILED DESCRIPTION OF THE PREFERRED EMBODIMENTS

The embodiments of the present invention will be explained below with reference to the accompanying drawings.

Figure 1:
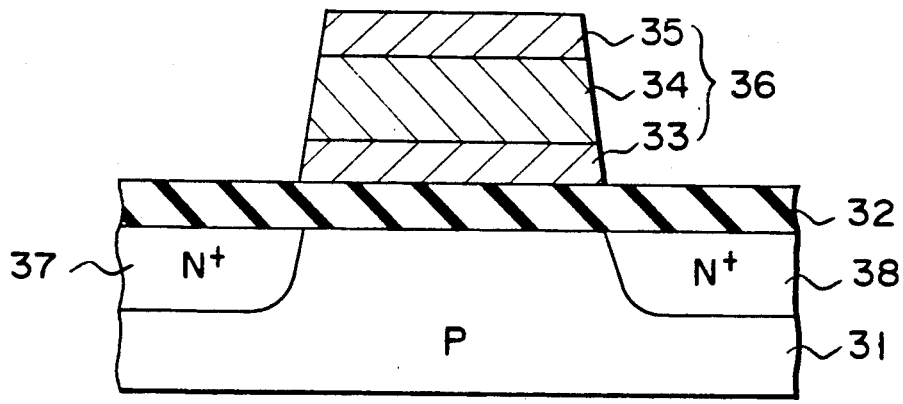
FIG. 1 is a cross-sectional view showing a conventional MOS FET.
Figure 2:
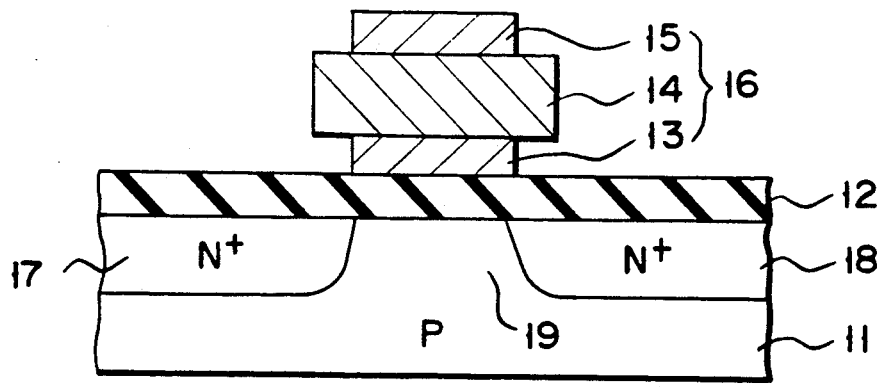
FIG. 2 is a cross-sectional view showing a MOS type semiconductor device according to a first embodiment of the present invention.

FIG. 2 is a view showing a MOS FET device's structure according to one embodiment of the present invention. In FIG. 2, reference numeral 11 shows a silicon semiconductor substrate of a P type. A gate oxide film 12 is formed on the silicon semiconductor substrate 11. A gate electrode 16 of a three-layered structure is formed over a location corresponding to a channel region 19 with the gate oxide film 12 situated therebetween, the three-layered structure being composed of a first high melting point silicide layer, such as an MoSi layer 13, having, for example, 1000 Å in thickness, a high melting point metal layer, such as a metal Mo layer 14, having, for example, 2000 Å in thickness, and a second high melting point metal silicide layer, such as an MoSi layer 15, having, for example, 1000 Å in thickness. N+ type diffusion layers 17 and 18 are formed as source and drain regions in the surface portion of the substrate 11 such that they are located one at each side of the channel region 19.

Here, the widths of the respective layers of the gate electrode 16, that is a length defined in a direction parallel to that in which the channel region of the MOS FET extends, are so set that the width of the MoSi layer 13 is made smaller than that of the metal Mo layer 14.

In the MOS FET having such a structure as set out above, the first MoSi layer 13 is located between the metal Mo layer 14 and the gate oxide film 12. Therefore, there is no risk that the metal Mo layer 14 will be separated from the rest of the structure even at a high temperature step of forming the aforementioned N+ type diffusion layers 17 and 18.

Further, the length of the channel region 19, that is a channel length, is determined by the width of the gate electrode 16 formed over the semiconductor substrate 11 and corresponds to a distance between the N+ type diffusion layers 17 and 18 corresponding to the source and drain regions. The aforementioned distance is such that, if the source and drain regions are formed by, for example, an ion implantation method, it corresponds to the width of the metal Mo layer 14 which substantially serves as a mask for ion implantation. Of the gate electrode 16 of the three-layered structure, the metal Mo layer 14 needs only to have a width corresponding to a channel length in which case the first MoSi layer 13 car be made smaller in width than the layer 14. Since, as set out above, the value of a gate capacitance in the MOS FET is determined in accordance with the width of the first MoSi layer 13, that is the lowest layer of the gate electrode 16, the embodiment of the MOS FET can adequately reduce the gate capacitance because the width of the layer 13 is made smaller.

Further, the resistive value of the gate electrode is determined by the resistive value of the lowest-resistivity metal Mo layer 14. The MOS FET of the present embodiment can reduce a gate's resistive value since the layer 14 can be made larger. This leads to a reduced gate capacitance and an excellent high frequency characteristic.

The present invention will be explained below in conjunction with the step for manufacturing a MOS FET of the aforementioned structure.

Figure 3A:
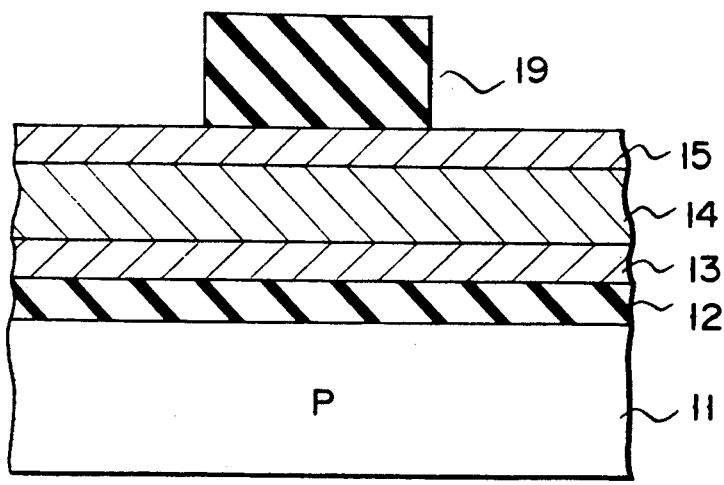
FIGS. 3A and 3B are cross-sectional views showing the steps of manufacturing the MOS type semiconductor device.

After a gate oxide film 12 has been formed by an oxidation method on the surface of a substrate 11, a first MoSi layer 13, metal Mo layer 14 and second MoSi layer 15 are sequentially deposited by a vapor deposition method over the substrate 11 as shown in FIG. 3A. Then a photoresist film 19 is deposited over the whole surface of the resultant structure, followed by an exposure step and developing step. In this way, the photoresist film 19 is left on that surface corresponding to a gate area.

Figure 3B:
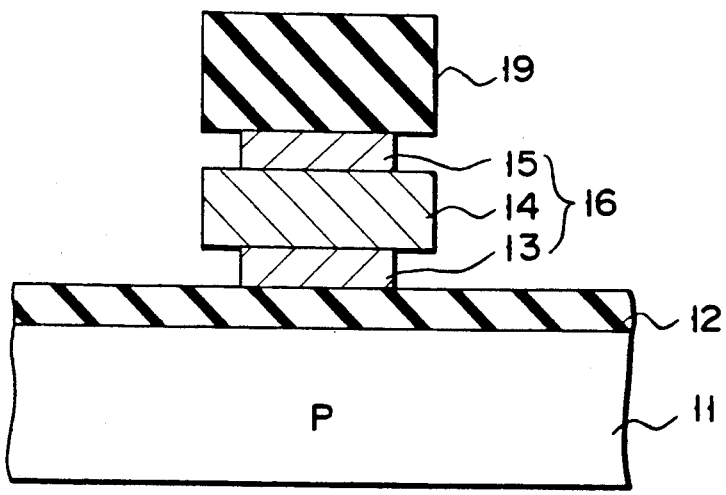

As shown in FIG. 3B, the three-layered structure, that is the first MoSi layer 13, metal Mo layer 14 and second MoSi layer 15, is etched, by a CDE (chemical dry etching), with the photo-resist film 19 used as a mask. At the time of etching, a $CF_4$ gas and $O_2$ gas are flowed at a flow rate of 100 (SCCM) and 150 (SCCM), respectively, under a high frequency power of 280 to 350 (W). A gate electrode 16 of a configuration as shown in FIG. 3B is formed over the substrate by the aforementioned etching method and condition. It is to be noted that, at the time of etching, a gate electrode of a better configuration was able to be obtained in a gas stream of $CF_4$ and $O_2$ at SCCM of below 300 and below 250, respectively. A better result was also able to be obtained under a high frequency power of over 200 W.

Then the photoresist film 19 as used at the etching step is separated, though not shown, from the rest of the structure and an N type impurity, such as arsenic (As), is ion implanted in the surface portion of the substrate 11 with the gate electrode 16 used as a mask. The N+ type diffusion layers 17 and 18 are formed in the surface portion of the substrate through a activation process at a heating step to provide source and drain regions with a channel region 19 defined therebetween as shown in FIG. 2.

When a MOS FET was manufacture, by the aforementioned method, with a channel length designed to be 2 μm, the first MoSi layer 13, metal Mo layer 14 and second MoSi layer 15 were 1.82 μm, 2.21 μm and 1.47 μm in width, respectively, in which case these layers was set to be 1000 Å, 2000 Å and 1000 Å in thickness, respectively. When, on the other hand, a MOS FET was manufactured by another method with a channel length designed to be 2 μm, a first high melting point metal silicide layer, high melting point metal layer and second high melting point metal silicide layer were 2.2 μm, 2.02 μm and 1.85 μm, respectively.

In comparison with the MOS FET manufactured in the conventional method (another method), the MOS FET revealed a decrease of a gate capacitance by 17.3% and decrease of a gate resistive valve. Further, in comparison with their output characteristic in a high frequency range, the output power and drain efficiency were improved to 1.3 times the conventional one and 1.1 times the conventional one.

Since in the MOS FET as shown in FIG. 2, the second MoSi layer 15 is present over the substrate, it is possible to control the width of the underlying metal Mo layer 14 by observing the shape of the second MoSi layer 15 when the gate electrode is patterned by etching.

Figure 4:
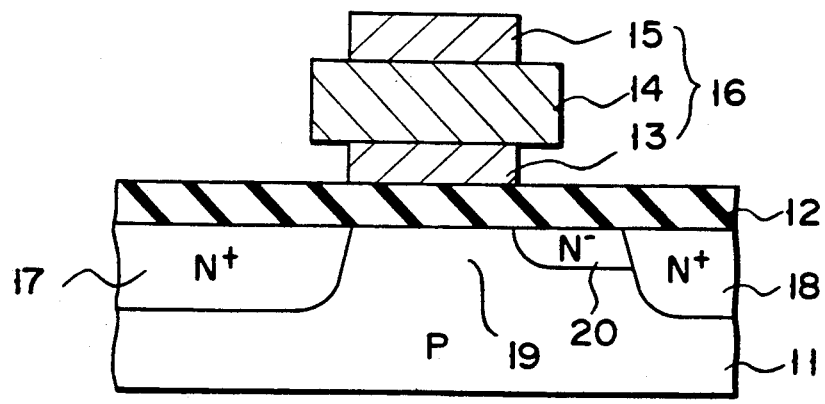
FIG. 4 is a cross-sectional view showing a MOS type semiconductor device according to a second embodiment of the present invention.

FIG. 4 shows a MOS FET according to a second embodiment of the present embodiment. In this embodiment, a gate electrode 16 is so formed over a substrate 11 as to have a three-layered structure composed of an MoSi layer 13, metal Mo layer 14 and MoSi layer 15. An N− type diffusion layer 20 of a low concentration is formed between a channel region 19 and an N+ type diffusion layer 18 serving as a drain region, that is, the drain region is composed of the N+ type diffusion layer of a high concentration and N− type diffusion layer of a low concentration to provide an LDD transistor.

FIG. 5 shows a MOS FET according to a third embodiment of the present invention. This embodiment is of a dual gate type having two gates. In the dual gate type MOS FET, the respective gate electrode 16 is so formed over a substrate as to have a three-layered structure composed of an MoSi layer 13, metal Mo layer 14 and MoSi layer 15 in which case the MoSi layer 13 has a smaller width than the metal Mo layer 14. In FIG. 5, reference numeral 21 shows an N+ type diffusion layer.

FIG. 6 shows a MOS FET according to a fourth embodiment of the present invention. A gate electrode 16 has such a three-layered structure as shown in FIG. 2. As will be appreciated from the above, the gate electrode 16 is of an interdigital type having leg sections. Source and drain regions S and D are so formed as to be alternately inserted between the leg portions of the interdigital type gate electrode 16 as shown in FIG. 6.

FIG. 7 shows a MOS FET according to a fifth embodiment of the present invention. This embodiment is different from the first embodiment shown in FIG. 2 except that a gate electrode 16 has a second MoSi layer 30 (top layer) and underlying metal Mo layer 14 of the same width. This structure can be achieved by the aforementioned method for forming the first MoSi layer 13 and second Mosi layer 15 in a manner to be made different in composition from each other.

FIG. 8 shows a MOS FET according to a sixth embodiment of the present invention. The embodiment is the same as the embodiment shown in FIG. 2 except that a second MoSi layer (top layer) 15 of the second embodiment is not formed over a substrate 11. This gate structure can achieve the same advantage as that of the first embodiment of FIG. 2.

The present invention is not restricted to the aforementioned embodiments. Various changes and modifications of the present invention may be made without departing from the spirit and scope of the present invention. Although, in the aforementioned embodiments, the high melting metal silicide layer and high melting metal layer have been explained as being an MoSi layer and metal Mo layer, use can be made, as the high melting metal silicide layer, of titanium silicide (TiSi) layer, tungsten silicide (WSi) layer, etc., and use can be made, as a high melting point metal layer, of titanium (Ti) layer, tungsten (W) layer, etc.

As set out above, the present invention provides a MOS type semiconductor device which can withstand a high temperature step or steps and reveal an excellent high frequency characteristic and a method for manufacturing the same.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A MOS type semiconductor device comprising:
a semiconductor substrate of a first conductivity type:
source and drain regions of a second conductivity type formed in a surface portion of the semiconductor substrate;
a channel region formed in the surface portion of the semiconductor substrate such that it extends between the source and drain regions;
a gate insulating film formed at least on the channel region; and
a gate electrode comprising a first high melting point metal silicide layer formed on the gate insulating film, a high melting point metal layer formed on the first high melting point metal silicide layer and a second high melting point metal silicide layer formed on the high melting point metal layer, in which a length of the first high melting point silicide layer defined in the same direction as that in which the channel region extends is made shorter in length than the high melting point metal layer.

2. The MOS type semiconductor device according to claim 1, wherein said first and second high melting point silicide layers are one selected from the group consisting of a molybdenum silicide layer, a titanium silicide layer and tungsten silicide layer and said high melting point metal layer is formed of a material selected from the group consisting of molybdenum, titanium and tungsten.

* * * * *